United States Patent [19]

Shu et al.

[11] Patent Number: 4,657,844

[45] Date of Patent: Apr. 14, 1987

[54] PLASMA DEVELOPABLE NEGATIVE RESIST COMPOSITIONS FOR ELECTRON BEAM, X-RAY AND OPTICAL LITHOGRAPHY

[75] Inventors: Jing S. Shu, Plano; Johnny B. Covington; Wei Lee, both of Richardson; Larry G. Venable, Grand Prairie; Gilbert L. Varnell, Dallas, all of Tex.

[73] Assignee: Texas Instruments Incorporated, Dallas, Tex.

[21] Appl. No.: 734,357

[22] Filed: May 14, 1985

Related U.S. Application Data

[62] Division of Ser. No. 507,656, Jun. 27, 1983, abandoned.

[51] Int. Cl.$^4$ ................................................ G03C 5/16
[52] U.S. Cl. .................................... 430/325; 430/311; 430/330; 430/282; 430/281; 430/909; 430/914; 430/921; 430/925; 156/643
[58] Field of Search ............... 430/325, 311, 330, 281, 430/282, 909, 914, 921, 925; 156/643

[56] References Cited

U.S. PATENT DOCUMENTS

| | | | |
|---|---|---|---|
| 4,020,234 | 4/1977 | Gardner | 428/433 |
| 4,136,102 | 1/1979 | Crivello | 96/115 R |
| 4,161,405 | 7/1979 | Crivello | 204/159.23 X |
| 4,241,165 | 12/1980 | Hughes et al. | 430/330 |
| 4,244,318 | 1/1981 | Chen | 427/240 |
| 4,245,029 | 1/1981 | Crivello | 430/281 X |
| 4,264,703 | 4/1981 | Crivello | 430/281 X |
| 4,278,753 | 7/1981 | Crivello | 430/281 X |
| 4,423,136 | 12/1983 | Crivello et al. | 430/281 |

Primary Examiner—John E. Kittle
Assistant Examiner—Cynthia Hamilton
Attorney, Agent, or Firm—Gary C. Honeycutt; N. Rhys Merrett; Melvin Sharp

[57] ABSTRACT

A negative resist composition including a polymeric matrix material, a polymerizable monomer, and an onium salt radiation sensitive initiator. The monomer is polymerized by irradiating the resist with an e-beam, x-ray, or ultraviolet source and heating the exposed resist. The resist is developed by a dry etchant such as plasma or a reactive ion etchant.

1 Claim, No Drawings

PLASMA DEVELOPABLE NEGATIVE RESIST COMPOSITIONS FOR ELECTRON BEAM, X-RAY AND OPTICAL LITHOGRAPHY

This is a division of application Ser. No. 507,656, filed June 27, 1983, now abandoned.

BACKGROUND OF THE INVENTION

This invention relates generally to compositions and methods for forming etch resistant masks, and more particularly to radiation sensitive negative resists for semiconductor device fabrication.

A resist is an adhering layer of a material on a support in which a pattern of openings are formed, through which the support is etched. The use of light as the radiation source to form the pattern in the resist is well known and was generally adequate until the advent of small geometry integrated circuits which require line widths on the order of 1 micron. Although 1 micron resolution can be obtained using photolithography in the laboratory, such line widths are generally not reproducible because of diffraction problems, the practical limit in a production environment being about 3 microns.

More recently, e-beam and x-ray lithography have been used to fabricate very large scale integrated circuit chips. In the case of e-beam technology, the beam is scanned across the resist to form the desired pattern. The e-beam may be controlled by a computer which has been programmed with the coordinates of a predetermined pattern. The use of the e-beam has thus eliminated the time lost in preparing a photographic reduction required to form the pattern. A disadvantage of this process is the long scan time necessary to expose the pattern in the resist, especially for very large scale integrated circuits. A resist which permits very high scanning speeds is necessary in order to use e-beam technology in a production environment. X-ray technology involves a flood exposure of the resist through a mask similar to that used in optical lithography, however, much narrower line widths can be formed.

Conventionally, there are two kinds of resists, positive and negative working resists. A resist whose exposed portion is more soluble in a developer than its unexposed portion is a positive resist. With a positive resist the exposed area is removed after exposure and developing. A resist whose exposed area is less soluble than the unexposed area is a negative resist, in which case the exposed area is retained after exposure and developing.

Resists suitable for one lithographic application are generally unsuitable for others. For example, a photoresist containing cyclolized polyisoprene and bisazide is very sensitive to ultraviolet radiation in the range of 300–450 mµ. Conversely, epoxidized materials which are known to be very sensitive to e-beam radiation are relatively insensitive to ultraviolet radiation.

Liquid developers are commonly used to remove the more soluble portion of resists after exposure. These developers may be aqueous basic solutions for positive resists, or organic solvents for both positive and negative resists. One problem encountered in using liquid developers is that they tend to penetrate the less soluble portion of the resist and cause swelling of the resist pattern. The extent of the swelling is minimal for most positive resists, but it is substantial for the crosslinkable negative resists. A low degree of solvent penetration may cause the resist to have a rough edge after drying, and for higher penetration the adjacent geometries may run together and collapse upon development, thus partially filling gaps in the pattern that are supposed to be open. Developer penetration and swelling are the major limitations to the resolution obtainable with most negative resists currently n use. Still another problem is the cost and disposal of the chemicals used in liquid developers.

SUMMARY OF THE INVENTION

Accordingly, the present invention overcomes many of the disadvantages of prior art resists by providing a negative resist system which can be applied to e-beam, x-ray and optical lighographic techniques, and which exhibits good film properties, adhesion to many types of substrate, high sensitivity to radiation exposure, and dry developing and etching capability.

The negative resist systems of the present invention include a plasma sensitive polymeric material exhibiting the above properties, for example, polyvinyl alcohols and styrene-polyvinyl alcohol copolymers, which acts as a matrix for a polymerizable solid monomer and an onium salt radiation sensitive initiator. Carbazole compounds are used as the monomer. A homogeneous solution of these components in an organic solvent is applied to a substrate to form a thin film which is selectively irradiated. The coated substrate is then heated to polymerize the monomer in the exposed areas and expel the monomer from the unexposed areas. The pattern generation is completed by dry etching the slice with plasma or a reactive ion etchant to remove resist from the unexposed areas.

The novel features believed characteristic of this invention are set forth in the appended claims. The invention itself, however, as well as other objects and advantages thereof, may be best understood by reference to the following detailed description.

DETAILED DESCRIPTION OF THE PREFERRED EMBODIMENTS

The materials used in the present invention are divided into three categories: polymeric materials, polymerizable solid monomers, and radiation sensitive initiators.

Polyvinyl alcohols and styrene-polyvinyl alcohol copolymers are used as the matrix polymer to accomodate the solid monomer and initiator. The matrix polymer must exhibit high compatibility with the solid monomer and initiator, high plasma or reaction ion etch capability, good film properties, and excellent thermal stability. Criteria of the selection of the polymerizable monomer include low vapor pressure when solid, susceptibility to cationic polymerization, high resistance to plasma or reactive ion etching compared to the matrix polymer, and significant vapor pressure of the solid at high temperature. The radiation sensitive initiator must be compatible with the matrix polymer and the solid monomer, reasonably soluble in commonly used organic solvents, and it must generate very strong acids upon irradiation.

In general, all of the polymeric materials used must be compatible with the monomer and the initiator. In this manner a higher percentage of monomer can be used to obtain a greater resist thickness remaining in the exposed area after the generation of the pattern image. Further, more initiator can be used to increase the radiation sensitivity. In addition, a homogenous film can be formed which minimizes the possibility of crystallization of the monomer and initiator. Finally, it is important that the polymeric material have weak dry etch resistance so that it is removed quickly upon developing.

It has been found that the photolysis of certain onium salts produces strong Bronsted acids which act as photoinitiators or catalysts of cationic polymerization and simultaneous free radical polymerization. E-beam and x-ray irradiation have been determined to have a similar effect on these onium salts. Diaryliodonium, triarylsulfonium and triarylselenium salts are particularly useful as initiators in the present resist system to polymerize the monomer. Generally, the radiation sensitivity of the resist is increased by increasing the percentage of onium salt.

The plasma sensitive polymeric material used as the matrix for the monomer and initiator in the resist is a polyvinyl acetal or a styrene-polyvinyl alcohol copolymer, which are compatible with carbazole group monomers and the onium salts described above. The polymer is selected from the group consisting of poly(vinyl formal)s, poly(vinyl butyral)s, poly(vinyl formal) and poly(vinyl butyral) blends, copolymers containing vinyl formal and vinyl butyral, and styrene-vinyl alcohol copolymers.

The plasma resistant monomer preferably has a significant vapor pressure so that the monomer in the unexposed areas of the resist will be easily expelled during developing. Suitable monomers that are compatible with the matrix polymer are 9-vinyl carbazole, 9-vinyl tetrahydro carbazole, 3-amino-9-vinyl carbazole, 3-chloro-9-vinyl carbazole, 3,6-dibromo-9-vinyl carbazole, 3-nitro-9-vinyl carbazole, 3, dimethylamino-9-vinyl carbazole, and 3-methylamino-9-vinyl carbazole.

The diaryliodonium salt preferably has the structure

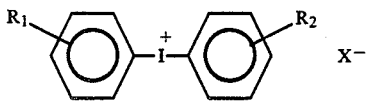

where $R_1$ and $R_2$ are selected from the alkyl, alkoxy, hydroxy, halo, carboxylic, and nitro groups, and $X^-$ is $BF_4^-$, $PF_6^-$, $AsF_6^-$, $SbF_6^-$, $Cl^-$, or $HSO_4^-$.

The triarylsulfonium and triarylselenonium salts have the structure

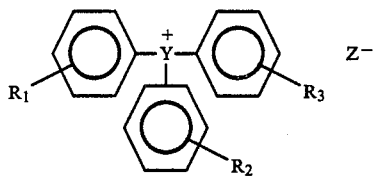

where $R_1$, $R_2$ and $R_3$ are selected from the same groups as $R_1$ and $R_2$ above, $Z^-$ is selected from the same group as $X^-$, and Y is S or Se.

A homogeneous resist solution is prepared by dissolving the polymer, monomer and initiator in an organic solvent, for example, 2-ethoxyethyl acetate, 2-methoxyethyl acetate, cyclopentanone, cyclohexanone, or chlorobenzene. The total percent solid by weight of the polymer, monomer and onium salt in the solution is about 5-30% of the solvent weight. The polymer is between about 50-80% by weight of the total solid, the monomer is about 10-45%, and the onium salt is about 5-20% of the weight of the monomer.

In a semiconductor fabrication process employing the present invention, the resist solution is spin coated onto a semiconductor slice and heated to remove the solvent. The thickness of the resist layer is on the order of about 1 micron. The coated slice is then selectively exposed to either e-beam, x-ray or ultraviolet radiation in the desired pattern, causing the onium salt in the exposed area to form a strong Bronsted acid. The slice is heated at a temperature of about 50°-150° C. for less than about 1 minute to about 20 minutes to polymerize the monomer in the exposed area while evaporating the monomer from the unexposed area. A portion of the monomer migrates to the exposed area where it is polymerized. As explained above the mechanism of polymerization is both cationic and free-radical, with cationic polymerization being the dominant process. It is believed that some crosslinking between the matrix polymer and the polymerized monomer might also occur. The evaporation and migration of the monomer decreases the thickness of the resist layer in the unexposed area, while the migration and polymerization of the monomer increases the thickness in the exposed area.

The resist image is developed in a plasma or a reactive ion reactor. The unexposed area is plasma etched at a much faster rate than the exposed area because the monomer has been evaporated and the matrix polymer is sensitive to the plasma etchant, while the exposed area is etch resistant. A reactive ion etch may also be employed, even though it is less selective than the plasma etch, because of the difference in the thickness of the exposed and unexposed areas. That is, because the unexposed resist thinner it is is completely etched away while a substantial portion of the exposed resist remains on the slice in the desired pattern. Typical plasma etch conditions are $O_2$ at 1 Torr, 100 watts for about 5 minutes, depending on the material to be etched. The process is completed by stripping the resist in the plasma reactor or by means of a wet etchant, for example, a strong organic solvent such as cholrobenzene or cyclohexanone.

In a particular example according to the present invention, the resist is prepared by dissolving 3.5 g. of poly(vinyl formal), 0.21 g. of 4,4'-dibutyldiphenyliodonium hexafluoroantimonate, and 1.75 g. of vinylcarbazole in 54 g. of cyclopentanone. The solution is filtered through a 0.2 micron filter, and the filtered resist is spin coated on a slice and baked at about 65° C. for 10 minutes to obtain a resist layer about 9000 Angstroms thick. The coated slice is then placed is an ultraviolet contact printer and exposed for about 10 seconds to ultraviolet radiation through a photomask. After exposeure, the slice is baked at about 100° C. for 12 minutes. At this time, the thickness of the exposed area is about 11000 Angstroms and the unexposed area is about 6000 Angstroms thick. The resist image is dry developed in a barrel plasma reactor under the under the developing condition of $O_2$ at 1 Torr, 100 watts for about 5 minutes. The unexposed areas are etched away and the remaining thickness of exposed resist after plasma developing is about 9000 Angstroms. Resolution of 1.5 microns line and space has been obtained compared to 3 microns for conventional negative photoresists used in optical lithography. The resist sensitivity with optical lithography is between about 5-50 mJ/cm².

In the case of x-ray irradiation, with an initial resist thickness of about 5400 Angstroms and a dose of about 60 mJ/cm$^2$, the final thickness of the exposed resist is about 5100 Angstroms. The radiation source may be aluminum and the wavelength is 8.24 Angstroms. The x-ray sensitivity is in the range of 10–100 mJ/cm$^2$ and the resolution is about 1 micron. Resolution with e-beam exposure at a dose of about 2 C/cm$^2$ is as low as 0.5 microns and the sensitivity is between 0.1–10 C/cm$^2$.

The present invention thus provides a high resolution negative resist system which is sensitive to e-beam, x-ray and optical irradiation, and which is developable by dry etching techniques.

Although specific examples of the invention have been described in detail, it is to be understood that various changes, substitutions, additives and alterations can be made therein without departing from the spirit and the scope of the invention as set forth in the appended claims.

What is claimed is:

1. A method of forming a patterned, high resolution, radiation sensitive negative resist comprising the steps of:

forming a thin film of a negative resist composition in cyclopentanone as a solvent comprising poly(vinyl formal), 4,4'-dibutyldiphenyl-iodonium hexafluoroantimonate, and vinyl carbazole;

selectively exposing said thin film to a predetermined pattern of x-ray, e-beam, or ultraviolet radiation;

heating the irradiated film; and developing the resist image by exposing said film to oxygen plasma, which selectively removes the areas of the film unexposed to the ultraviolet radiation.

* * * * *